United States Patent [19]

Anantha et al.

[11] Patent Number: 4,510,676

[45] Date of Patent: Apr. 16, 1985

[54] METHOD OF FABRICATING A LATERAL PNP TRANSISTOR

[75] Inventors: Narasipur G. Anantha; Santosh P. Gaur, both of Hopewell Junction; Yi-Shiou Huang; Paul J. Tsang, both of Poughkeepsie, all of N.Y.

[73] Assignee: International Business Machines, Corporation, Armonk, N.Y.

[21] Appl. No.: 558,740

[22] Filed: Dec. 6, 1983

[51] Int. Cl.³ .......................................... H01L 21/265
[52] U.S. Cl. .................................... 29/577 C; 29/578; 148/187
[58] Field of Search ......... 148/187; 29/577 R, 577 C, 29/578; 357/35

[56] References Cited

U.S. PATENT DOCUMENTS

| | | | |
|---|---|---|---|
| 3,873,989 | 3/1975 | Schinella et al. | 357/35 |
| 4,298,402 | 11/1981 | Hingarh | 357/35 X |
| 4,329,703 | 5/1982 | Priel et al. | 357/35 |
| 4,339,767 | 7/1982 | Horng et al. | 357/35 X |
| 4,407,060 | 10/1983 | Sakurai | 148/1.5 X |
| 4,419,809 | 12/1983 | Riseman et al. | 148/187 X |
| 4,431,460 | 2/1984 | Barson et al. | 148/1.5 |
| 4,446,611 | 5/1984 | Bergeron et al. | 148/187 X |

OTHER PUBLICATIONS

Yeh, IBM T. D. B., "Self-Aligned Integrated NPN (Vertical) and (Lateral) Structures", vol. 22, No. 9, Feb. 1980, pp. 4047-4051.

Primary Examiner—G. Ozaki
Attorney, Agent, or Firm—Sughrue, Mion, Zinn, Macpeak, and Seas

[57] ABSTRACT

A method for making a lateral PNP transistor simultaneously with an NPN transistor and the resultant device wherein a first mask defines a base-width by the resistor implant for a P-type resistor and a second mask is overlaid asymmetrically on said first mask to partially cover the collector. At the same time that the NPN extrinsic base contact is made, P-type dopants are introduced in the areas exposed by the first and second masks to provide an emitter and a collector contact for the PNP transistor.

4 Claims, 13 Drawing Figures

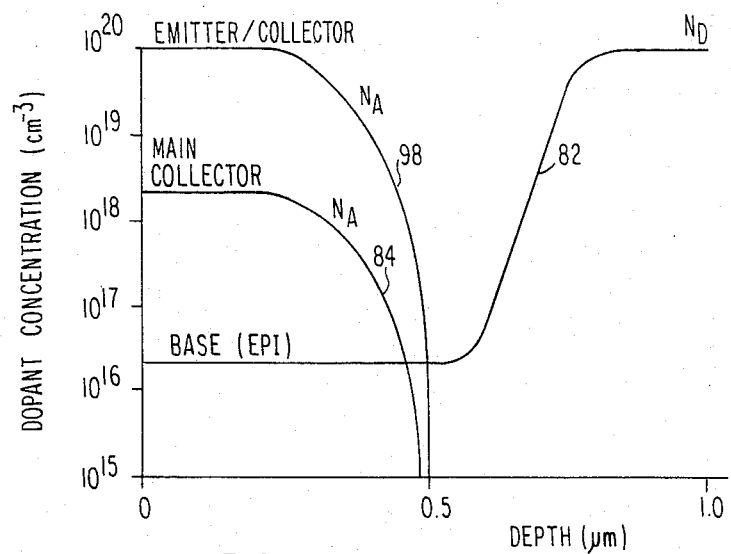
FIG. 12
FIG. 13
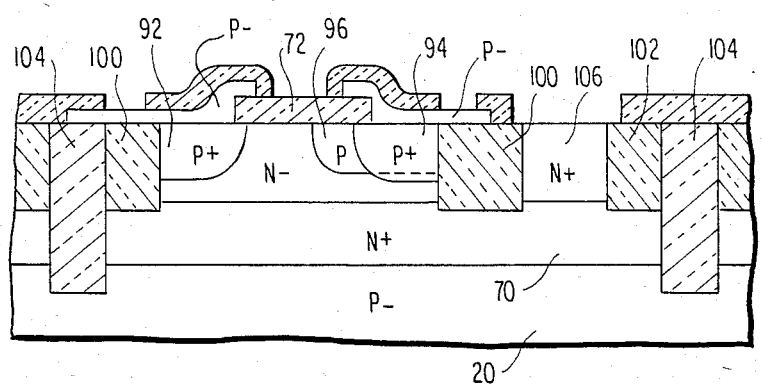

4,510,676

METHOD OF FABRICATING A LATERAL PNP TRANSISTOR

BACKGROUND OF THE INVENTION

1. Technical Field

This invention relates generally to a method of fabricating a lateral PNP transistor, and in particular relates to a method of fabricating a lateral PNP transistor with a graded collector simultaneously with fabricating NPN transistors.

2. Prior Art

One type of transistor which has found wide application in integrated circuits is the lateral PNP transistor. In this type of transistor, two regions near the surface of a semiconducting material are doped P-type and form respectively the emitter and collector. The emitter and collector are separated along the surface by an N-type region, which forms the base of the transistor. In order to obtain high operating speeds, the base is made as narrow as possible. However, two problems ensue. If the base-collector junction is reverse-biased, the depletion region extends into the narrow base region and at a punch-through voltage will extend through the base to the emitter. Once the depletion region has punched through, current control of the transistor is lost. If however, the depletion width is maintained relatively narrow for a given voltage by increasing the doping level of the base region, the resultant high electric field in the depletion region may exceed the electric field for avalanche breakdown. The current multiplication associated with avalanche also destroys current control.

The fabrication of PNP transistors becomes particularly difficult when they are to be included in an integrated circuit fabricated with an NPN technology. That is, the integrated circuit is to include both NPN and PNP transistors. As with any integrated circuit method, the number of processing steps and particularly of mask levels should be minimized. The necessity for simultaneously fabricating both NPN and PNP transistors has caused design trade-offs which sacrifice the performance of the PNP transistors built.

A typical processing sequence for fabricating a conventional vertical NPN bipolar transistor will now be described. As shown in FIG. 1, a P-type silicon substrate 20 is overlaid with an oxide layer 22 which is etched to provide a collector window 24 and an isolation window 26 surrounding the collector window 24. Then with a series of photo-resist masking steps and diffusion steps, an N+ sub-collector 28 and a P+ isolation region 30 are formed on the surface of the substrate 20. Thereafter the oxide layer 22 is stripped and an N− epitaxial layer 32 is grown, as shown in FIG. 2.

Thereafter, as shown in FIG. 3, additional masking and diffusion steps are used to diffuse N-type and P-type dopants from the surface to form an N+ sub-collector reach-through 34 that joins the N+ sub-collector 28 and to form a larger P+ isolation region 36. An isolated N− region 74 is isolated from the sub-collector 28 by the isolation region 36. A field oxide 38 is grown on top of this structure that has a thickness greater over the P+ isolation region 36. Then, as shown in FIG. 4, ion implantation is used to form a P-type base P(B) 40 at the surface of a part of the N+ sub-collector 28 within the isolation region 36. The ion implantation is done through the field oxide 38 and the resultant base 40 further defines an N− collector 42. The field oxide 38 serves to protect the surface of ion-implanted regions.

A blocking mask 44 of photo-resist is used as shown in FIG. 5 to cover the transistor region within the P+ isolation region 36 and thereafter another ion implantation of P-type dopants is performed through the field oxide 38 to form a P-type resistor P(R) 46. As shown in FIG. 6, with yet another mask and another ion implantation through the field oxide 38, P-type dopants are used to form a P+ base contact 48 and a P+ resistor contact 50, as shown in FIG. 6.

Then, as shown in FIG. 7, an N+ dopant is diffused into the base 40 to form an N+ emitter 52. The result is a vertical NPN transistor between the emitter 52, the base 40 and the collector 42. The field oxide is preferentially etched above the base contact 48 part of the base 40, above the emitter 52, above the N+ sub-collector reach-through 34 and above the base contact 50. Finally, interconnection metallurgy is evaporated onto the surface in a predetermined pattern to form a base lead 54, an emitter lead 56, a collector lead 58 and a resistor lead 60.

Although methods are known to fabricate PNP transistors and particularly lateral PNP transistors within this sequence of NPN fabrication steps, these transistors have suffered the previously described problems of low punch-through voltage, low avalanche breakdown voltage or poor performance as measured by gain and frequency response.

Methods have been described which increase the performance of transistors by providing graded doping within the base region. Such a method has been described for a lateral PNP transistor by E. A. Valsamakis in an article entitled "Lateral PNP with Gain Bandwidth Product", in the *IBM Technical Disclosure Bulletin*, vol. 13, 1970, pg. 1457. A completely different method has been described for a graded base PNP transistor in U.S. Pat. No. 3,873,989 issued to Schinella et al. However, it is not known how either of these methods can be easily incorporated within an NPN fabrication technology.

SUMMARY OF THE INVENTION

Accordingly, it is an object of this invention to provide a high performance PNP transistor with a high punch-through voltage and a high avalanche breakdown voltage.

It is yet a further object to provide a method of fabricating a PNP transistor with a minimal change from standard and conventional NPN fabrication technology.

The invention can be summarized as a method of fabricating a lateral PNP transistor consistent with NPN technology and having high performance and high operating voltages. In this method the NPN transistor implant through a field oxide is used to define a base width between an emitter and a collector of a PNP transistor. A second level photo-resist is then applied over part of the base photo-resist and part of the collector. The field oxide is removed from the emitter and the area of the collector not covered by either level of photo-resist. The P+ contact formation in the NPN technology is used to form the emitter and collector of the PNP transistor. As a result, the PNP transistor has a graded collector.

BRIEF DESCRIPTION OF THE DRAWINGS

FIG. 12 is a graph of the doping profile of a PNP transistor built according to this invention.

FIG. 13 is a cross-sectional view of an alternative embodiment of this invention.

DETAILED DESCRIPTION OF THE PREFERRED EMBODIMENTS

The fabrication of a lateral PNP transistor, according to this invention, can be easily integrated into the NPN transistor fabrication previously described with reference to FIGS. 1–7. In this respect, the PNP transistor can be considered a free lateral PNP transistor because it involves no major additional processing steps, although the steps are somewhat modified, from those required for the NPN technology.

Figure 1:
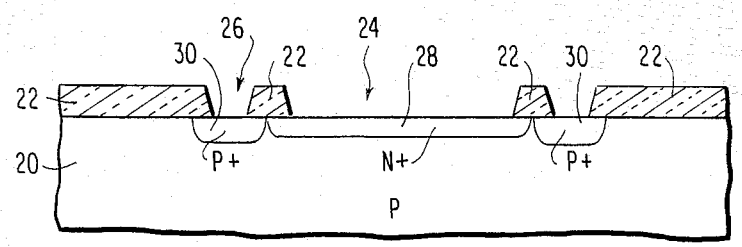
FIGS. 1–7 describe a prior art method of fabricating a vertical NPN transistor.
Figure 2:
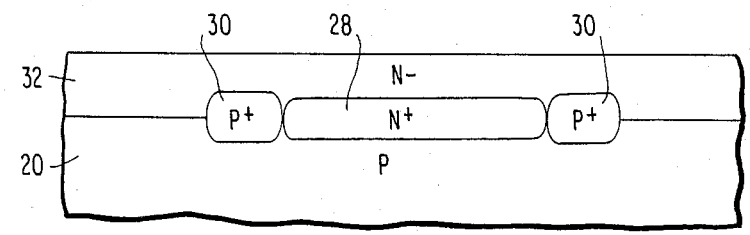
Figure 3:
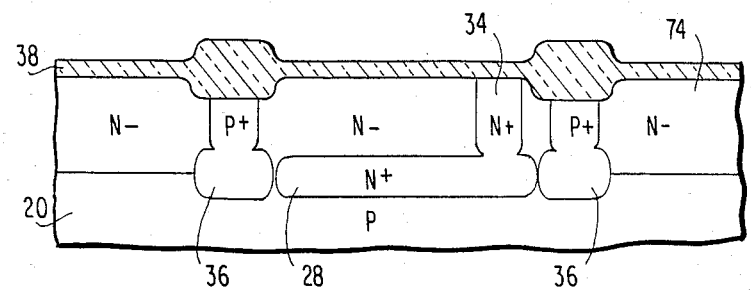
Figure 4:
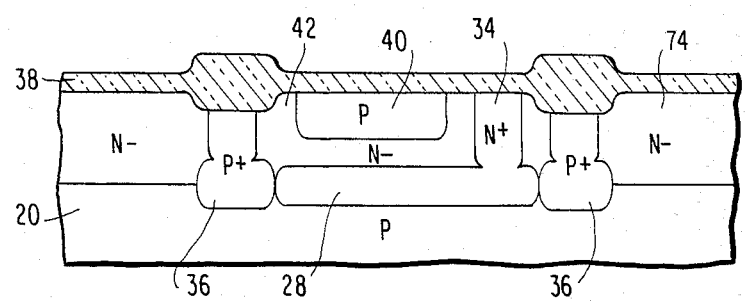
Figure 5:
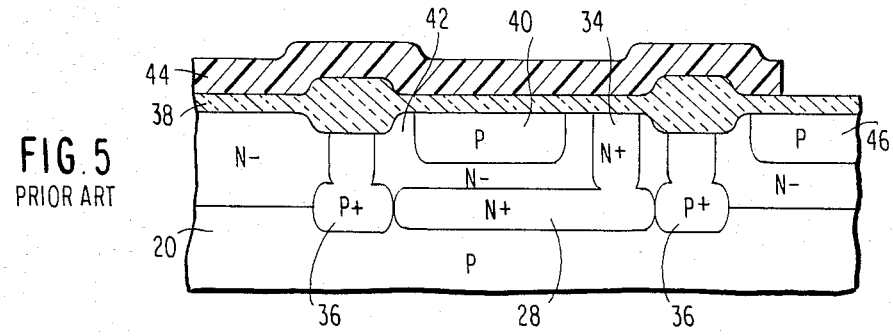
Figure 8:
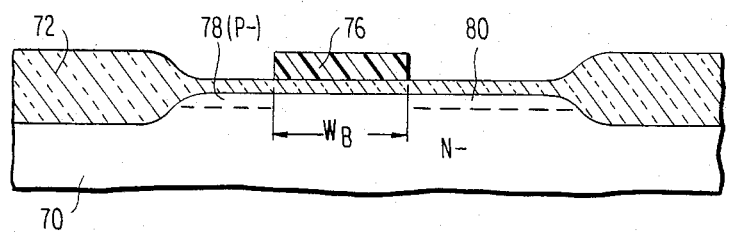
FIGS. 8–11 describe a method of fabricating the PNP transistor of this invention.

Referring now to FIG. 8, a structure of an N⁻ epitaxial layer 70 and an overlying field oxide 72 are fabricated according to the previously described NPN technology at the step shown in FIG. 3. The N⁻ epitaxial layer can, for instance, be that part 74 of the N⁻ epitaxial layer isolated from the PNP transistor by the isolation region 36, as shown in FIG. 3. A level of photo-resist 76 is deposited on top of the thin portion of the field oxide 72 and its width $W_B$ defines the width of the base of the PNP transistor. This photo-resist layer 76 is deposited at the same time as the blocking mask 44 shown in FIG. 5 which is used to mask the implant of the P-type resistor 46.

The photo-resist level 76 is then plasma-hardened or alternatively hardened by ultraviolet radiation and then high temperature post-baked. Thereafter the ion implant for forming the P-type resistor passes through the field oxide 72 and forms a nascent emitter region 78 and a nascent collector region 80.

Figure 6:
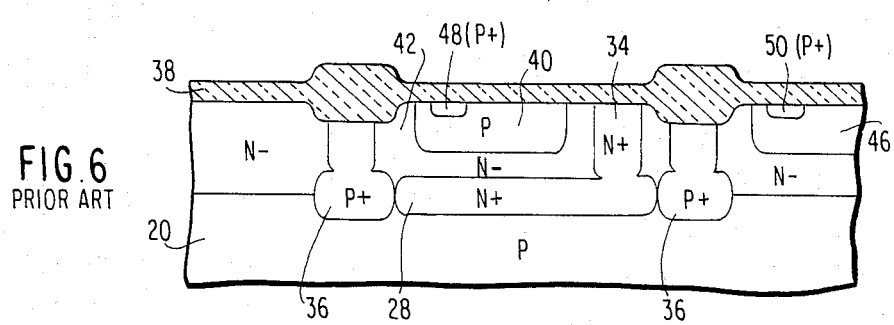
Figure 7:
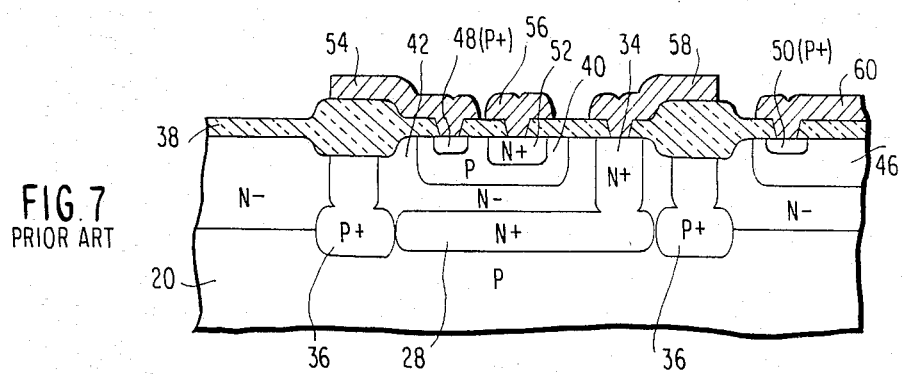
Figure 9:
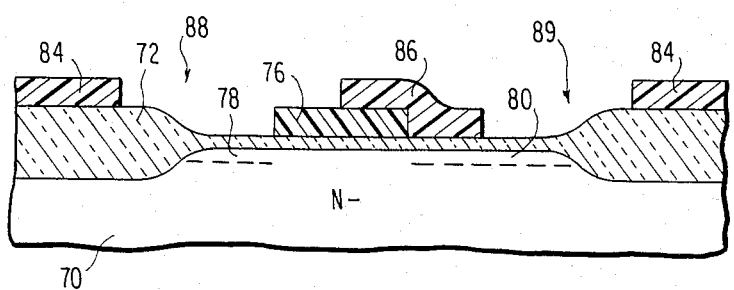

Then a second photo-resist layer 84 and 86 is simultaneously deposited and then patterned to define an emitter contact window 88, a collector contact window 89 as shown in FIG. 9, and base contact and resistor contact windows (not shown) corresponding to base contact and resistor contact 50 of FIG. 6. The second photo-resist layer 86 partially overlays the first photo-resist layer 76 and also overlays part of the nascent collector region 80, as shown in FIG. 9. As a result, the first photo-resist layer 76 continues to define the emitter-base junction of the PNP transistor. This junction is self-aligned and no additional level-to-level tolerances need to be assigned to the emitter-base junction. Previous methods of fabricating a lateral PNP transistor within an NPN technology have removed the first photo-resist layer 76 before replacing it with the second photo-resist layer 86. The second photo-resist layer was thus necessarily symmetric with respect to the base and could not provide the graded collector to be described later. Furthermore, the emitter-base junction was not self-aligned and thus required larger emitter areas to compensate for level-to-level tolerances of the two photo-resist layers 76 and 86.

Figure 10:
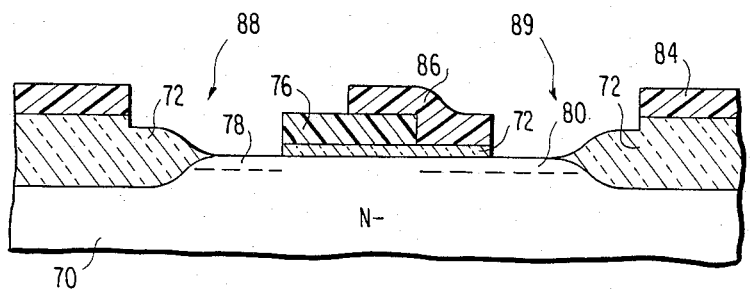
Figure 11:
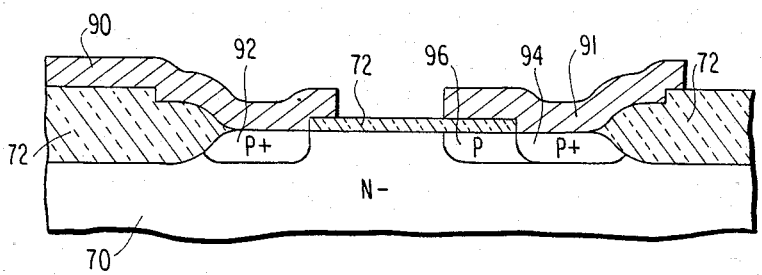

Then, as shown in FIG. 10, the emitter contact window 88 and collector contact window 89 are opened by etching off the silicon dioxide 72 by reactive ion etching. All of the nascent emitter region 78 and part of the nascent collector contact region 80 are exposed by this opening. Emitter and collector contacts are then formed by a high dose ion implantation of boron to make the two regions degenerate or nearly degenerate. Then, as illustrated in FIG. 11, both levels of photo-resist 76, 84 and 86 are stripped and an interconnection metallurgy 90 and 91 are deposited. The pattern covers all of the exposed emitter and collector regions 78 and 80. The interconnection metallurgy 90 and 91 can be either an aluminum-silicon-copper alloy or heavily doped P-type polysilicon. In the latter case, the emitter/collector ion-implantation step can be avoided. Instead, a heat treatment step is carried out to drive the P-type dopants from the polysilicon 90 and 91 in to form a P+ emitter 92 and a P+ collector contact region 94. The part of the nascent collector 80 which is not further doped in this drive-in forms a main collector 96. The combination of the main collector region 96 and the P+ collector contact region 94 forms a graded collector.

The doping profile that results from this drive-in is shown by profile 98 in FIG. 12. Profile 82 is the doping profile for the epitaxial layer 70 which has a depth of about 0.7 μm on top of the substrate 20. Profile 84 represents the acceptor concentration introduced by the resistor ion implantation which has a depth of about 0.5 μm. The profiles shown in FIG. 12 are the final profiles which may have been broadened by heat treatment subsequent to implantation. Of course, when the acceptor concentration $N_A$ as represented by profile 84 falls below the donor concentration $N_D$ as represented by profile 82, then the effective carrier type and concentration is represented by the larger value. As is evident by the two P-type profiles 84 and 98, the collector contact region 94 is not simply a surface contact but extends approximately to the depth of the main collector 96. As a result, the conduction path is substantially horizontal into the collector 96 and 94. The absence of additional conduction paths vertically into the area of the emitter contact 92 eliminates slow response on the emitter side of the PNP transistor caused by vertical injection. The N-type doping profile 82 is the profile for the base, the P-type profile 84 is the profile for the main collector 96, and the P-type profile 98 is the profile for the emitter 92 and the collector contact region 94. Also included in the structure for the lateral PNP transistor but not shown in FIG. 11 is an N+ reach-through to the N⁻ base region 70. This reach-through is similar to the reach-through 34 to the N+ sub-collector 28 shown for the NPN transistor of FIG. 7. Both reach-throughs perform the same purpose of providing a surface contact to a buried region.

Aside from the compatibility of this process with NPN technology, the lateral PNP transistor of FIG. 11 has the following advantages. The base width $W_B$ is defined by a single level of photo-resist 76, although additional side diffusion occurs in a controlled way in subsequent heat treating steps. The emitter-base junction is self-aligned so that the emitter 92 can be designed with minimal surface area. A small emitter 92 reduces vertical injection and provides higher lateral injection efficiency, has a low capacitance and thus provides a higher speed transistor and one with higher current gain. The main collector 96 has a low doping or a high resistance and thus helps to reduce the field concentration at the base-collector junction, resulting in an increased punch-through voltage and reduced avalanche multiplication at the collector-base junction. The highly doped and relatively large P+ collector contact region 94 reduces the collector resistance.

An alternative embodiment of the resultant PNP transistor is shown in FIG. 13. Device definition is provided by thick oxide regions 100 and 102 (or called shallow SiO$_2$ trenches) that reach down to the N+ layer 70. Device isolation is provided by an even deeper oxide region 104 (or called deep SiO$_2$ trenches) that reaches down to the P− substrate 20 and replaces the P+ isolation region 36. A N+ reach-through 106 extending down to the N+ epitaxial layer 70 provides a contact to the base 106. In other respects, this device corresponds to the PNP transistor shown in FIG. 11.

A numerical simulation of the PNP transistor illustrated in FIG. 13 shows that if the base width W$_B$ equals 1.5 μm and if the area of the emitter 92 equals 8.2 μm$^2$, then the current gain is equal to 43 at V$_{EB}$=0.6 V (I$_C$=82 nA) and is 2.2 at V$_{EB}$=0.9 V (I$_C$=0.32 mA). In comparison with a conventional lateral PNP transistor with an emitter area of 12.7 μm$^2$ and with resistor ion implants in both the emitter and collector, this device at V$_{EB}$=0.9 V has twice the current gain and 27% less capacitance across the emitter-base junction.

We claim:

1. A method for making an asymmetrical lateral PNP transistor having a graded collector junction simultaneously with the process steps for making NPN transistors and P-type resistors, comprising the steps of:

forming a semiconducting region into which said PNP and NPN transistors and said resistors are to be formed, by forming said semiconducting region containing isolated N+ regions and overlying N− regions;

forming at least one P− region, simultaneously with forming said resistors, one of said P− layers being adjacent a portion of one of said N− regions to define a collector-base junction of said PNP transistor;

forming a first P+ region, simultaneously with forming bases of said NPN transistors, adjacent another portion of said N− region to define an emitter-base junction of said PNP transistor;

forming a second P+ region substantially to the depth of said P− region, simultaneously with forming said first P+ region, adjacent said P− region for establishing a collector contact region of said PNP transistor; and forming an N+ region, simultaneously with forming collector reach-throughs of said PNP transistors, extending from the surface of said semiconducting region to said isolated N+ region for establishing a base contact region of said PNP transistor.

2. A method for making an asymmetrical lateral PNP transistor, as recited in claim 1, wherein the step of forming the P− region comprises the steps of:

forming a first mask layer over portions of said N− regions, said first mask layer defining a base width for said PNP transitor and an area for said P-type resistors; and introducing a P-type dopant into the areas of said N− regions not covered by said first mask layer.

3. A method for making an asymmetrical lateral PNP transistor, as recited in claim 2, wherein said introducing step is an ion-implantation into said N− region.

4. A method for making an asymmetrical lateral PNP transistor, as recited in claim 2, wherein the steps of forming said first and second P+ regions comprise the steps of:

removing said first mask layer in areas of said NPN transistors and said P-type resistors;

then forming a second mask layer over portions of said first mask layer defining the PNP base width and over an adjacent portion of said P− region, said second mask layer further defining base contacts for said NPN transistors; and then introducing P-type dopants into said semiconductor region, said first and second mask layers blocking said introduction into overlaid areas, thereby forming an emitter and a collector contact of said PNP transistor.

* * * * *